(12) United States Patent
Wallace et al.

(10) Patent No.: US 6,431,884 B1
(45) Date of Patent: Aug. 13, 2002

(54) APPARATUS AND METHOD FOR SHIELDING A CIRCUIT FROM ELECTROMAGNETIC INTERFERENCE

(75) Inventors: David Lee Wallace, Wixom; Michael Patrick McGlynchey, Novi, both of MI (US)

(73) Assignee: TRW Inc., Lyndhurst, OH (US)

( * ) Notice: Subject to any disclaimer, the term of this patent is extended or adjusted under 35 U.S.C. 154(b) by 0 days.

(21) Appl. No.: 09/767,489

(22) Filed: Jan. 23, 2001

(51) Int. Cl.[7] .................................................. H01R 4/58
(52) U.S. Cl. ........................................ 439/86; 439/606
(58) Field of Search ............................ 439/86, 88, 607, 439/901, 931, 606

(56) References Cited

U.S. PATENT DOCUMENTS

| | | | |
|---|---|---|---|
| 4,337,989 A | 7/1982 | Asick et al. | 339/143 R |
| 5,564,949 A | * 10/1996 | Wellinsky | 439/607 |
| 5,774,344 A | 6/1998 | Casebolt | 361/800 |
| 5,827,585 A | 10/1998 | Giannetti | 428/36.2 |
| 5,872,332 A | 2/1999 | Verma | 174/35 C |
| 5,926,952 A | * 7/1999 | Ito | 29/883 |
| 6,016,083 A | 1/2000 | Satoh | 333/12 |

* cited by examiner

*Primary Examiner*—Gary Paumen
*Assistant Examiner*—Ann McCamey
(74) *Attorney, Agent, or Firm*—Tarolli, Sundheim, Covell, Tummino & Szabo L.L.P.

(57) ABSTRACT

A housing (10) for shielding a circuit (12) from electromagnetic interference comprises at least one electrically conductive connector pin (50) having a central portion, a first end portion (62) and a second end portion (66). The housing (10) also comprises an insulator (70). The central portion of the connector pin (50) is disposed within the insulator (70). The first end portion (62) and the second end portion (66) of the connector pin (50) extend outward from the insulator (70). The housing (10) includes a housing body (20) made from an electrically conductive moldable plastic material (22). The housing body (20) is molded over at least a portion of the insulator (70) to secure the insulator and thereby the connector pin (50) in the housing (10).

8 Claims, 2 Drawing Sheets

APPARATUS AND METHOD FOR SHIELDING A CIRCUIT FROM ELECTROMAGNETIC INTERFERENCE

TECHNICAL FIELD

The present invention relates to an apparatus and associated method for housing a circuit and, more particularly, to an apparatus and associated method for shielding a circuit from electromagnetic interference.

BACKGROUND OF THE INVENTION

Electronic circuitry is used in a wide variety of applications, such as controlling the deployment of air bags in a occupant protection system. An electronic circuit is often formed or mounted upon a circuit board. The operation of electronic circuitry can be adversely affected by electromagnetic interference. Shielding electronic circuitry from electromagnetic interference can, therefore, improve the operation of the circuit.

The amount of electromagnetic interference to which electronic components are exposed can be limited by locating the components in a protective housing which shields the components from the interference. U.S. Pat. No. 5,872,332 discloses a molded housing with EMI shield. A metal shield is stamped from sheet metal into a box shape. The stamped metal box shields the circuit from electromagnetic interference. The metal box is then insert molded into a plastic housing. A circuit board containing necessary components is then placed within and secured to the housing.

U.S. Pat. No. 5,774,344 discloses a metallized plastic RFI/EMI shield for a circuit card. The shield is formed of a box enclosure with two casing halves.

SUMMARY OF THE INVENTION

The present invention is directed to a housing and associated method for shielding a circuit from electromagnetic interference.

In accordance with one exemplary embodiment of the invention, a housing for shielding a circuit from electromagnetic interference comprises at least one electrically conductive connector pin having a central portion, a first end portion and a second end portion. The housing also comprises an insulator. The central portion of the one connector pin is disposed within the insulator. The first end portion and the second end portion of the one connector pin extend outward from the insulator. A housing body is made from an electrically conductive moldable plastic material. The housing body is molded over at least a portion of the insulator to secure the insulator and thereby the connector pin in the housing.

In accordance with another exemplary embodiment of the invention, a method of making a housing for shielding a circuit from electromagnetic interference includes the steps of providing at least one electrically conductive connector pin for connection with the circuit in the housing; providing an electrically non-conductive insulator; securing the connector pin in the insulator to form a sub-assembly; providing a mold for forming the housing; placing the subassembly at least partially in the mold; providing an electrically conductive moldable plastic material; and molding the plastic material in the mold to form the housing. The molding step includes molding the plastic material over at least a portion of the insulator to secure the insulator and thereby the connector pin to the housing.

BRIEF DESCRIPTION OF THE DRAWINGS

The foregoing and other features and advantages of the present invention will become more apparent to one skilled in the art upon consideration of the following description of the invention and the accompanying drawings, in which.

DESCRIPTION OF EXEMPLARY EMBODIMENTS

Figure 1:
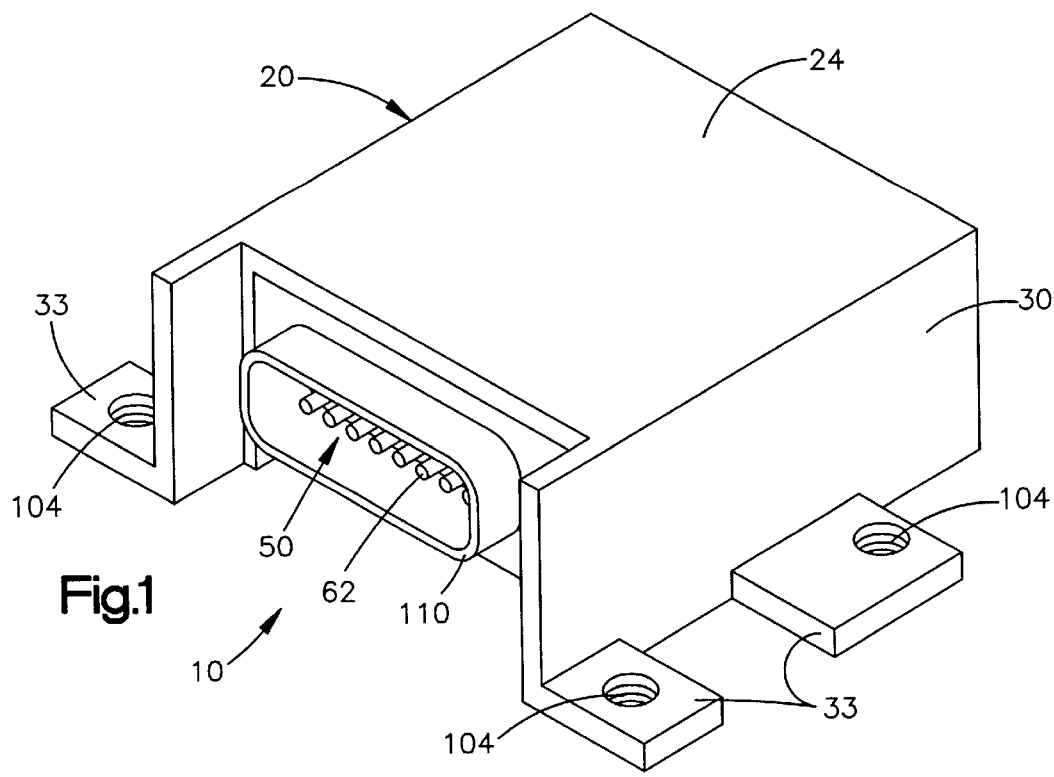
FIG. 1 is a top perspective view of a housing in accordance with the present invention.
Figure 2:
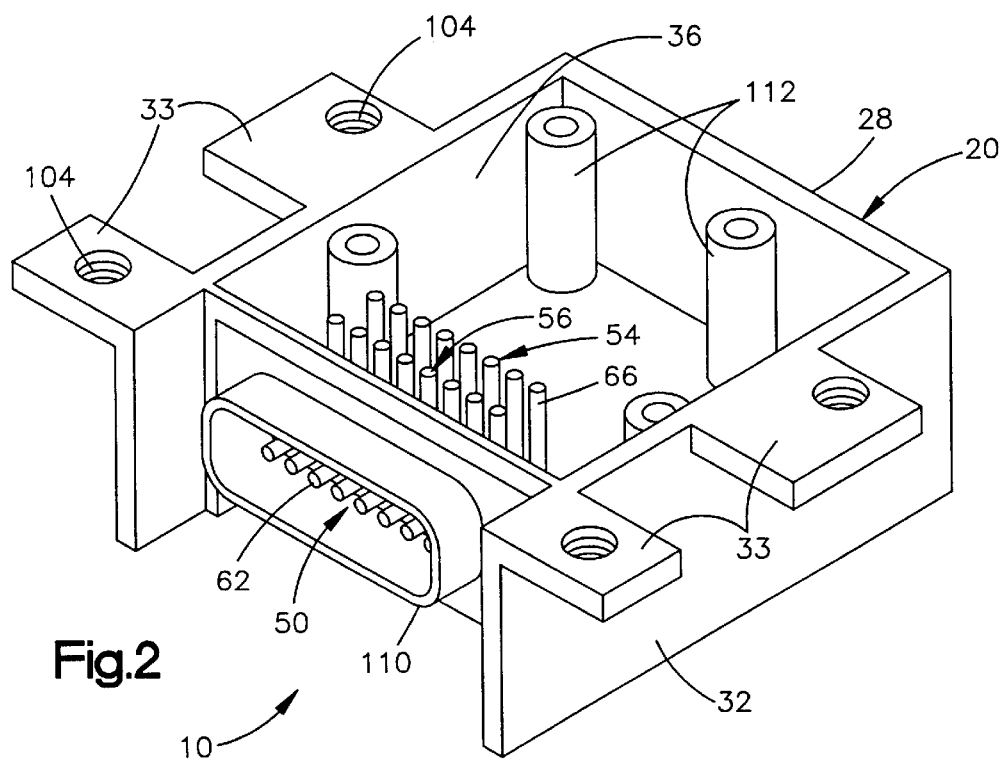
FIG. 2 is a bottom perspective view of the housing of FIG. 1.

The present invention relates to an apparatus and method for housing a circuit. The present invention is applicable to various housing constructions. As representative of the present invention, FIG. 1 illustrates a housing 10 for shielding a circuit 12 (FIG. 3).

Figure 3:
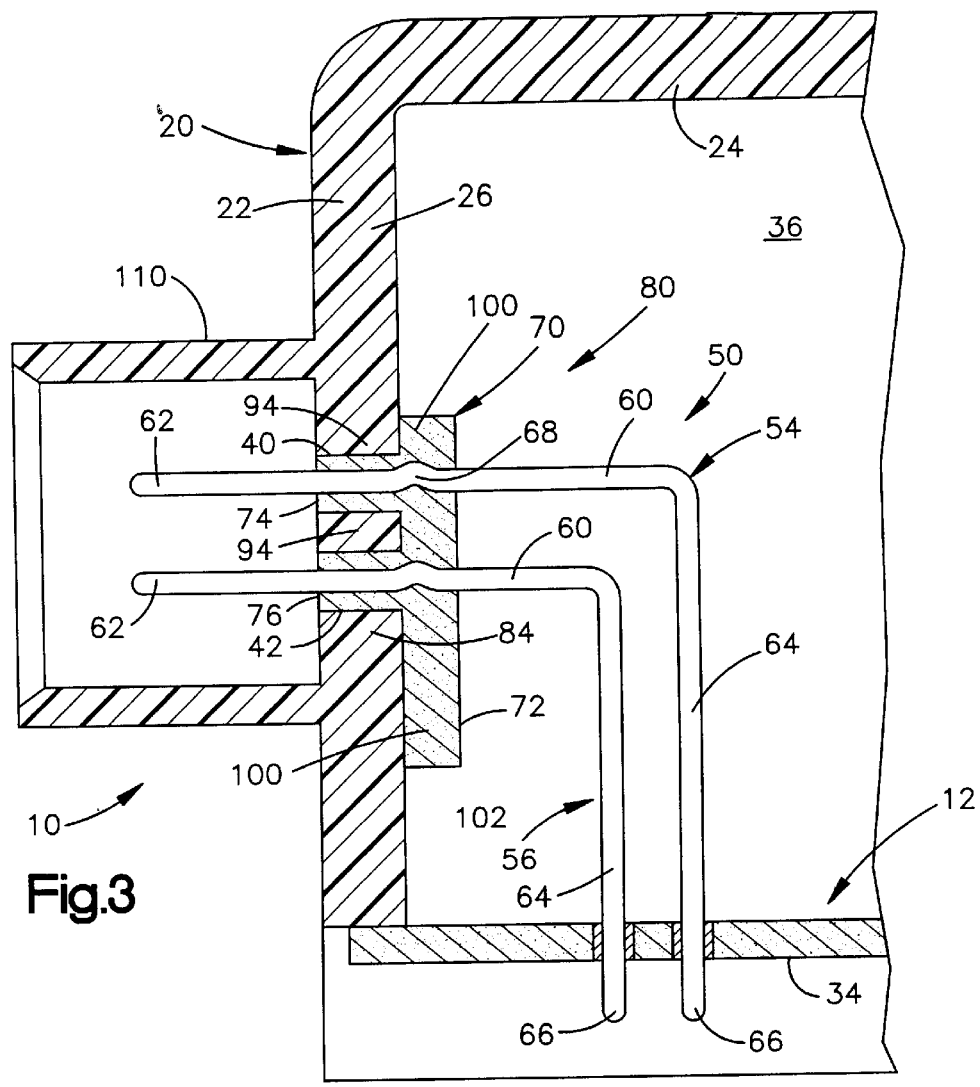
FIG. 3 is a sectional view of a portion of the housing of FIG. 1, showing a mechanical interconnection between the housing and a connector pin subassembly and also showing a portion of a circuit in the housing.

The housing 10 includes a main body portion, or housing body 20, made from an electrically conducting plastic material 22 (FIG. 3). The housing body 20 may be made from any suitable type of electrically conductive moldable plastic, including synthetic polymers, natural polymers, composites of synthetic polymers, composites of natural polymers, and/or any combinations thereof.

The housing body 20 is formed as a single body of plastic material 22 molded, as described below, into the illustrated configuration. The thickness of the material 22 is selected so that the housing body 20 can adequately shield, from electromagnetic interference, a circuit such as a circuit used to control the deployment of air bags in a vehicle.

In the illustrated embodiment, the housing body 20 has a box-shaped configuration having a plurality of walls. The plurality of walls includes a top wall 24, a front wall 26 and an opposite back wall 28, and two opposite side walls 30 and 32. The housing body 20 does not have a bottom wall, so that the circuit 12 can be inserted into and attached to the housing body. The housing body 20 also includes a plurality of mounting flanges, or ears, 33, which project from the side walls 30 and 32.

The illustrated circuit 12 is used in controlling the deployment of one or more air bags in an occupant protection system. The circuit 12 includes several electronic components arranged and interconnected on a circuit board 34. The housing body 20 has an interior volume 36 (FIG. 5) that is adapted to receive, and at least partially enclose, the circuit board 34 including the circuit 12.

Two elongate slots 40 and 42 are formed by molding in the front wall 26 of the housing body 20. The slots 40 and 42 extend parallel to each other and are the same length as each other. A grounding pin opening (not shown) may also be formed in the front wall 26 of the housing body 20, at one end of the pair of slots 44 and 46. More than one grounding pin opening could be provided, to ensure better grounding.

The housing 10 includes a plurality of connector pins 50 for connecting the circuit board 34 to an external device (not shown), such as an air bag module. The number of connector pins 50 is dependent on the configuration of the circuit 12 on the circuit board 34. In the illustrated example, two rows of eight or more connector pins 54 and 56, respectively, are provided.

Each one of the connector pins 54 and 56 in each row is illustrated as being identical to all the other pins in that row, and similar in configuration (if not size) to the pins in the other row, also. It should be understood that the connector pins 54 and 56 need not be identical to each other, and could have configurations different than illustrated, so long as they provide sufficient electrical interconnection with the circuit 12 as described below.

Figure 4A:
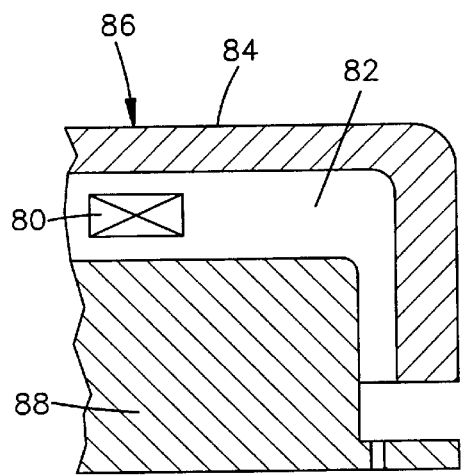
FIG. 4A is a partial sectional view showing schematically a step in a process of molding the housing of FIG. 1.
Figure 4B:
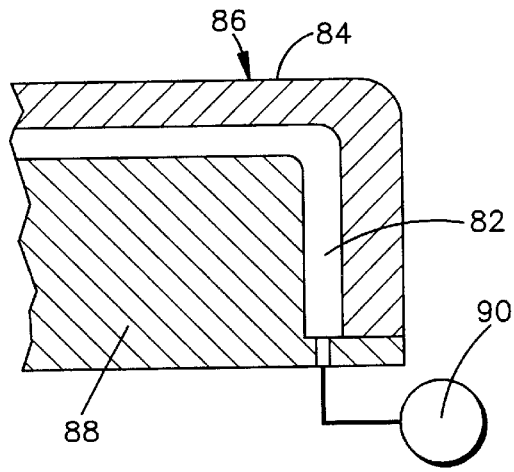
FIG. 4B is a view similar to FIG. 4A showing schematically another step in the process of molding the housing of FIG. 1.

Each connector pin 54 or 56 (FIG. 4) is a generally L-shaped member made from an electrically conductive material, such as metal. The L-shaped configuration of each pin 54 or 56 includes a first leg 60 having a first end portion 62 of the connector pin, and a second leg 64 having a second end portion 66 of the connector pin. The first leg 60 of the connector pin 54 or 56 preferably has a bend 68 shown in FIG. 3.

The connector pins 54 and 56 are mounted in an insulator block, or insulator, 70. The insulator 70 is made from an electrically insulating material. The insulator 70 has a base portion 72 and two projecting portions 74 and 76. The insulator 70 has two rows of openings for receiving the first legs 60 of the connector pins 54 and 56. The two rows of openings are spaced apart by the same distance as the centers of the slots 40 and 42 in the front wall 26 of the shielding component 20.

The connector pins 54 and 56 may be associated within the insulator 70 in any suitable manner, such as by insert molding a plurality of separate connector pins. In a preferred embodiment, the insulator 70 is insert molded with the connector pins 54 and 56 to form a subassembly 80, which is thereafter associated with the other parts of the housing 10 in a manner described below. The bends 68 on the first legs 60 of the connector pins 54 and 56 help to prevent the pins from being pulled out of the insulator 70. The first and second end portions 62 and 66 of the connector pins 54 and 56 extend outward from the insulator 70.

The housing body 20 is secured to the insulator block 70 by a suitable process, such as injection molding (insert molding). The molding process is described briefly as follows.

At least a portion of the subassembly 80 (shown schematically in FIG. 4A) is placed in a cavity 82 in an outer die piece 84 of a mold 86. An inner die piece 88 is then placed into the outer die piece 84. Molten plastic material is then injected from a pump 90 and fills the cavity 82 between the inner die 88 and the outer die 84. The molten plastic sets into the shape of the housing body 20. The die pieces 84 and 88 are then removed.

During the molding process, portions 94 (FIG. 3) of the plastic material 22 flow over and bond to the projecting portions 74 and 76 of the insulator block 70. The projecting portions 74 and 76 of the insulator block 70 extend through the openings or slots 40 and 42, which are formed in place in the front wall 26 during the molding process.

Because the insulator 70 is molded with the housing body 20, the insulator 80 fits snugly within the slots 40 and 42, thus sealing the housing 10 and preventing unwanted debris and/or elements, such as water, from entering the housing. The molding process effects an improved seal, as compared to inserting one pre-formed component into a preformed opening in another pre-formed component.

When the molding process is completed, the subassembly 80 of the insulator 70 and the connector pins 54 and 56 is securely mounted on the front wall 26 of the housing body 20. The projecting portions 74 and 76 of the insulator 70 extend through the slots 40 and 42, respectively, in the front wall 26 of the housing body 20.

As a result, the first end portions 62 of the connector pins 54 in the first row extend outward from the housing body 20, through the first slot 40 in the front wall 26 of the housing body 20. The second end portions 66 of the connector pins 54 in the first row extend inward into the interior volume 36 of the housing body 20.

The first end portions 62 of the connector pins 56 in the second row extend outward from the housing body 20, through the second slot 42 in the front wall 26 of the shielding component 20. The second end portions 66 of the connector pins 56 in the second row extend inward into the interior volume 36 of the housing body 20.

The first end portions 62 of the connector pins 54 and 56 extend outward from the insulator block portions 74 and 76. The first end portions 62 of the connector pins 54 and 56 can, therefore, be connected to a device external to the housing 10, such as an air bag module, for example. The second end portions 66 of the connector pins 54 and 56 extend into the interior volume 36 of the housing body 20. The second end portions 66 of the pins 54 and 56 can be operatively connected to the circuit 12 on the circuit board 34.

The insulator 70 prevents the connector pins 54 and 56 from coming into contact with the electrically conductive housing body 20. The insulator 70 thereby prevents electrical conduction between the electrically conductive housing body 20 and the electrically conductive connector pins 54 and 56. The insulator 70 includes portions 100, which abut an inner side surface 102 of the front wall 26 of the housing body 20, to prevent the insulator 70 from being pulled off the front wall.

In the illustrated embodiment, all of the connector pins 54 and 56 are associated with one insulator 70. Alternatively, individual connector pins may be associated with one or more individual insulator members. In that case, the housing body 20 would have a larger number of openings, to accommodate the number of separate insulators used. Minimizing the size and number of the openings in the housing body 20, however, helps to increase the interference shielding capability of the housing body. Therefore, it is preferred that the openings in the housing body 20 be kept to a minimum.

The mounting ears 33 of the housing body 20 can be directly connected to ground by, for example, mounting screws (not shown) extending through openings 104 in the mounting ears. Such an electrical connection of the housing body 20 to ground effectively provides a ground for the circuit 12 in the housing 10, without the need for a large opening in the housing body to pass through a ground wire.

One portion 110 of the housing body 20 forms a shroud. The shroud 110 partially encloses, and protects, the projecting first end portions 62 of the connector pins 54 and 56. The shroud 110 receives an electrical connector (not shown) by which the connector pins 54 and 56 are electrically connected with the external device.

The housing body 20, when molded, preferably forms a plurality of mounting bosses 112 within the interior volume 36 of the housing. The mounting bosses 112 are adapted to receive mounting members (not shown), such as screws, for fastening the circuit board 34 inside the housing 10. When the circuit board 34 is thus fastened to the housing body 20, pads on the circuit board engage the second end portions 66 of the connector pins 54 and 56, to establish the needed electrical connections with the circuit board.

From the above description of the invention, those skilled in the art will perceive improvements, changes and modifications in the invention. Such improvements, changes and modifications are intended to be included within the scope of the appended claims.

Having described the invention, we claim:

1. Apparatus comprising a housing and a circuit;

said circuit including a plurality of electronic components arranged and interconnected on a circuit board;

said housing including a housing body made from an electrically conducting plastic material and formed as a single body of molded plastic material;

said housing body having an interior volume that is adapted to receive, and at least partially enclose, said circuit board including said circuit;

said housing body having a box-shaped configuration including a top wall, a front wall, a back wall, and opposite side walls, said front wall having opposite inner and outer side surfaces;

said housing body having at least one elongate slot formed by molding in said front wall of said housing body, said slot extending between said inner and outer side surfaces of said front wall;

said housing further including a plurality of connector pins for connecting said circuit board to an external device, such as an air bag module, each one of said connector pins having a generally L-shaped configuration and being made from an electrically conductive material, such as metal;

the L-shaped configuration of each connector pin including a first leg having a first end portion of the connector pin, and a second leg having a second end portion of the connector pin;

said plurality of connector pins being mounted in an insulator that is made from an electrically insulating material;

said insulator having a base portion and a projecting portion, said insulator having a row of openings in said projecting portion for receiving said first legs of said connector pins;

said first legs of said connector pins extending through said openings in said projecting portion of said insulator, and said first end portions of said connector pins projecting outward from said projecting portion of said insulator;

said projecting portion of said insulator extending through said slot that is molded in said front wall of said housing body so that said first end portions of said connector pins extend outward from said housing body through said slot in said front wall of said housing body;

said second end portions of said connector pins extending inward into the interior volume of said housing body; and said base portion of said insulator abutting an inner side surface of said front wall of said housing body at a location adjoining said slot to prevent said insulator from being pulled off said front wall in a direction parallel to said first end portions of said connector pins.

2. An apparatus as set forth in claim 1 wherein said first leg of each one of said connector pins has a bend, said bends being located in said insulator, said bends helping to prevent said connector pins from being pulled out of said insulator.

3. An apparatus as set forth in claim 1 wherein said front wall of said housing body extends over and bonds to said projecting portion of said insulator so that said projecting portion of said insulator fits snugly within said slot to seal said housing body at the location of said slot.

4. An apparatus as set forth in claim 1 wherein said housing body further includes a plurality of mounting flanges, or ears, which project from said side walls, and which are adapted to be directly connected to ground by mounting screws extending through openings in said mounting ears.

5. A An apparatus as set forth in claim 1 wherein said housing body forms a plurality of mounting bosses within the interior volume of said housing, said mounting bosses being adapted to receive mounting members, such as screws, for fastening said circuit board inside said housing body so that pads on said circuit board engage said second end portions of said connector pins to establish electrical connections with said circuit board.

6. An apparatus as set forth in claim 1 wherein said first leg of each one of said connector pins has a bend, said bends being located in said insulator, said bends helping to prevent said connector pins from being pulled out of said insulator, and wherein said front wall of said housing body extends over and bonds to said projecting portion of said insulator so that said projecting portion of said insulator fits snugly within said slot to seal said housing body at the location of said slot.

7. An apparatus as set forth in claim 1 wherein said housing body further includes a plurality of mounting flanges, or ears, which project from said side walls, and which are adapted to be directly connected to ground by mounting screws extending through openings in said mounting ears, and wherein said housing body forms a plurality of mounting bosses within the interior volume of said housing, said mounting bosses being adapted to receive mounting members, such as screws, for fastening said circuit board inside said housing body so that pads on said circuit board engage said second end portions of said connector pins to establish electrical connections with said circuit board.

8. An apparatus as set forth in claim 7 wherein said first leg of each one of said connector pins has a bend, said bends being located in said insulator, said bends helping to prevent said connector pins from being pulled out of said insulator, and wherein said front wall of said housing body extends over and bonds to said projecting portion of said insulator so that said projecting portion of said insulator fits snugly within said slot to seal said housing body at the location of said slot.

* * * * *